US008587146B2

(12) United States Patent
Beneditz et al.

(10) Patent No.: US 8,587,146 B2
(45) Date of Patent: Nov. 19, 2013

(54) SOLID STATE CONTACTOR ASSEMBLY

(75) Inventors: Bruce D. Beneditz, Roscoe, IL (US); Michael Anthony Futrell, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 92 days.

(21) Appl. No.: 13/154,893

(22) Filed: Jun. 7, 2011

(65) Prior Publication Data

US 2012/0313429 A1 Dec. 13, 2012

(51) Int. Cl.
*B60L 1/00* (2006.01)

(52) U.S. Cl.
USPC .......... 307/9.1

(58) Field of Classification Search
USPC .......... 307/9.1
See application file for complete search history.

(56) References Cited

U.S. PATENT DOCUMENTS 5,466,974 A 11/1995 Sutrina et al.
6,036,508 A 3/2000 Anderson et al.
6,069,029 A 5/2000 Murakami et al.
6,084,764 A 7/2000 Anderson
6,448,671 B1 9/2002 Wallace et al.
6,611,066 B2 8/2003 Onizuka et al.
7,173,347 B2 2/2007 Tani et al.
7,463,468 B2 * 12/2008 Thiery .......... 361/82
7,837,496 B1 11/2010 Pal
2004/0090120 A1 5/2004 Lamberg et al.
2007/0108963 A1 5/2007 Wavering et al.
2008/0048495 A1 2/2008 Weger
2009/0072622 A1 3/2009 Goto et al.
2009/0160259 A1 6/2009 Naiknaware et al.
2009/0200864 A1 8/2009 Maier
2009/0228223 A1 * 9/2009 Liu et al. .......... 702/59
2009/0243764 A1 10/2009 Hauenstein
2010/0054005 A1 3/2010 Grosskopf et al.

FOREIGN PATENT DOCUMENTS

DE 102006003157 B3 4/2007
DE 102008001114 A1 10/2009
EP 0736828 A2 10/1996
EP 1521354 A2 4/2005

OTHER PUBLICATIONS

Extended European Search Report mailed on Aug. 20, 2012 for EP Application 12171062.8.

* cited by examiner

*Primary Examiner* — Robert L. Deberadinis
(74) *Attorney, Agent, or Firm* — Carlson, Gaskey & Olds, P.C.

(57) ABSTRACT

An example solid state contactor assembly includes a switching element having a field-effect transistor and a diode in parallel. The switching element is configured to communicate electric current along a current flow path extending from a first bus bar to a second bus bar. A control device is configured to selectively communicate current along a portion of the current flow path through the field-effect transistor or the diode of the switching element.

21 Claims, 4 Drawing Sheets

24
28
40
87
82b
70b
60b
66b
74b
50b
52b
64b
GATE DRIVE
76b
72b
80b
82a
78b
+
-
76a
64a
60a
66a
80a
87
74a
GATE DRIVE
50a
52a
34
36
78a
72a
78a
41
70a 24
28
87
82b
70b
60b
66b
64b
76b
GATE DRIVE
74b
50b
52b
72b
40
80b
82a
78b
+
-
64a
76a
60a
66a
80a
87
34
36
GATE DRIVE
74a
50a
52a
72a
78a
41
70a

SOLID STATE CONTACTOR ASSEMBLY

BACKGROUND

This disclosure relates to power distribution systems and, more specifically, to solid state contactors between busses.

In a typical electrical power distribution system, such as an aircraft electrical power distribution system, a power center includes at least one essential bus for distributing power to various components. A plurality of power sources may communicate power to the essential bus, including any number of AC and DC busses. The power sources are typically coupled to the essential bus using a DC contactor and a diode in series, which undesirably adds size and weight to the system. There is also a significant power loss when standard power diodes are used to conduct current.

SUMMARY

An example chip on bus bar solid state contactor assembly includes a switching element having a field-effect transistor and a diode in parallel. The switching element is configured to communicate electric current along a current flow path extending from a first bus bar to a second bus bar such that the switching element determines a direction of the electrical current. A control device is configured to selectively communicate current along a portion of the current flow path through the field-effect transistor or the diode of the switching element.

An example power distribution system for an aircraft includes a first DC bus having a first bus bar. The first DC bus is electrically isolated from a second DC bus having a second bus bar. An aircraft component is electrically connected to the first bus bar. A solid state contactor assembly electrically connects the first bus bar and the second bus bar. The contactor assembly includes a control device and a plurality of switching elements. Each switching element includes a field-effect transistor and diode in parallel. The control device is configured to drive the switching elements to control an electrical current between the first and second bus bars such that the switching elements determine a direction of the electrical current.

An example method of electrically connecting a first bus bar and second bus bar includes electrically connecting the first bus bar to the second bus bar using a solid state contactor assembly. The solid state contactor assembly has multiple switching elements each having a field-effect transistor and diode in parallel. The direction of current flow between the first bus bar and the second bus bar is controlled using the plurality of switching elements.

These and other features of the present disclosure can be best understood from the following specification and drawings, the following of which is a brief description.

DETAILED DESCRIPTION

Figure 1:
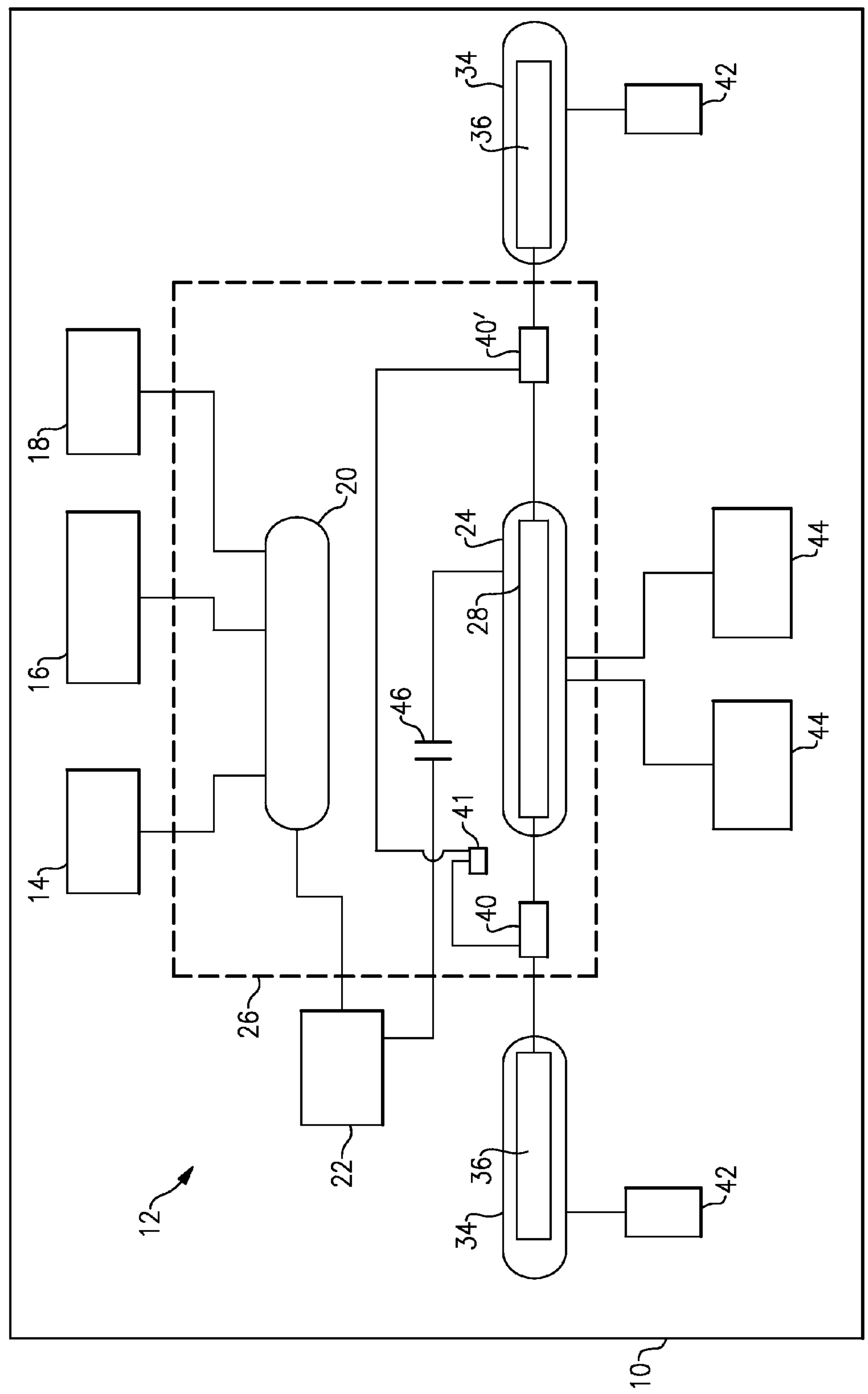
FIG. 1 is a schematic view of an aircraft power distribution system including solid state contactor ("SSC") assemblies.

Referring to FIG. 1, an aircraft 10 includes a power distribution system 12 having a first generator 14, a second generator 16, and a ram air turbine 18 electrically coupled to an AC bus 20. The AC bus 20 is electrically coupled to a transformer rectifier unit 22 ("TRU"), which converts AC into DC. The TRU 22 is electrically coupled to an essential DC bus 24 and provides DC to the essential DC bus 24.

Essential DC bus 24 includes a bus bar 28. In addition to being supplied current from the TRU 22, the essential DC bus 24 can be supplied current by a plurality of secondary DC busses 34. Each secondary bus 34 is electrically isolated from essential DC bus 24. Each secondary bus 34 includes a bus bar 36. A power source 42, such as a battery, is electrically coupled to each secondary bus 34 and provides power to each secondary bus 34. Busses 34, being powered by a battery 42, are generally a lower voltage than the output of TRU 22. In one example, SSC assembly 40 is configured so that current from bus 34 will instantaneously power essential DC bus 24 when TRU 22 fails. Additionally, current from TRU 22 is blocked from flowing to battery 42 unless battery charging is needed. The bus bar 36 of each secondary bus 34 is electrically coupled to the bus bar 28 of the essential DC bus 24 through a solid state contactor ("SSC") assembly 40. In this example, the SSC assembly is a chip on bus bar SSC assembly 40 such that the components of the SSC assembly 40 are disposed directly on an internal bus bar 87 (shown in FIG. 2A-2C). However, other SSC assemblies 40 may be used. The essential DC bus 24 is connected to components 44 such that the essential DC bus 24 provides power to the external components 44.

In one example, the AC bus 20 and essential DC bus 24 are disposed within electrical power center 26. In this example, the electrical power center 26 is an emergency electrical power center 26 such that the TRU 22 is conducting about 200 A, and the output of the essential DC bus 24 is about 28V. However, it is within the contemplation of this disclosure to use other electrical power centers having additional components, and different power distribution.

In operation, the first generator 14, second generator 16, or ram air turbine 18 supply power to the AC bus 20. The AC bus 20 distributes current to the TRU 22, which converts the AC to DC. TRU 22 provides DC through a switch 46 to the essential DC bus 24. Essential DC bus 24 can receive alternate DC from the secondary busses 34 through SSC assembly 40. Essential DC bus 24 distributes power to external components 44, such as electronics, controls, or other external devices. A power panel control unit 41 selects the power sources 14, 16, 18 and controls the logic of the SSC assembly 40.

Although only one SSC assembly 40 or 40' is shown, connecting one of the bus bar 36 to the associated one of the bus bar 28, multiple SSC assemblies 40, 40' could be used. SSC assemblies 40, 40' may be located on the bus bars 28, 36 of any of the essential DC bus 24 or secondary busses 34. Additionally, any number of secondary busses 34 may be used, depending on system requirements.

Figure 2A:
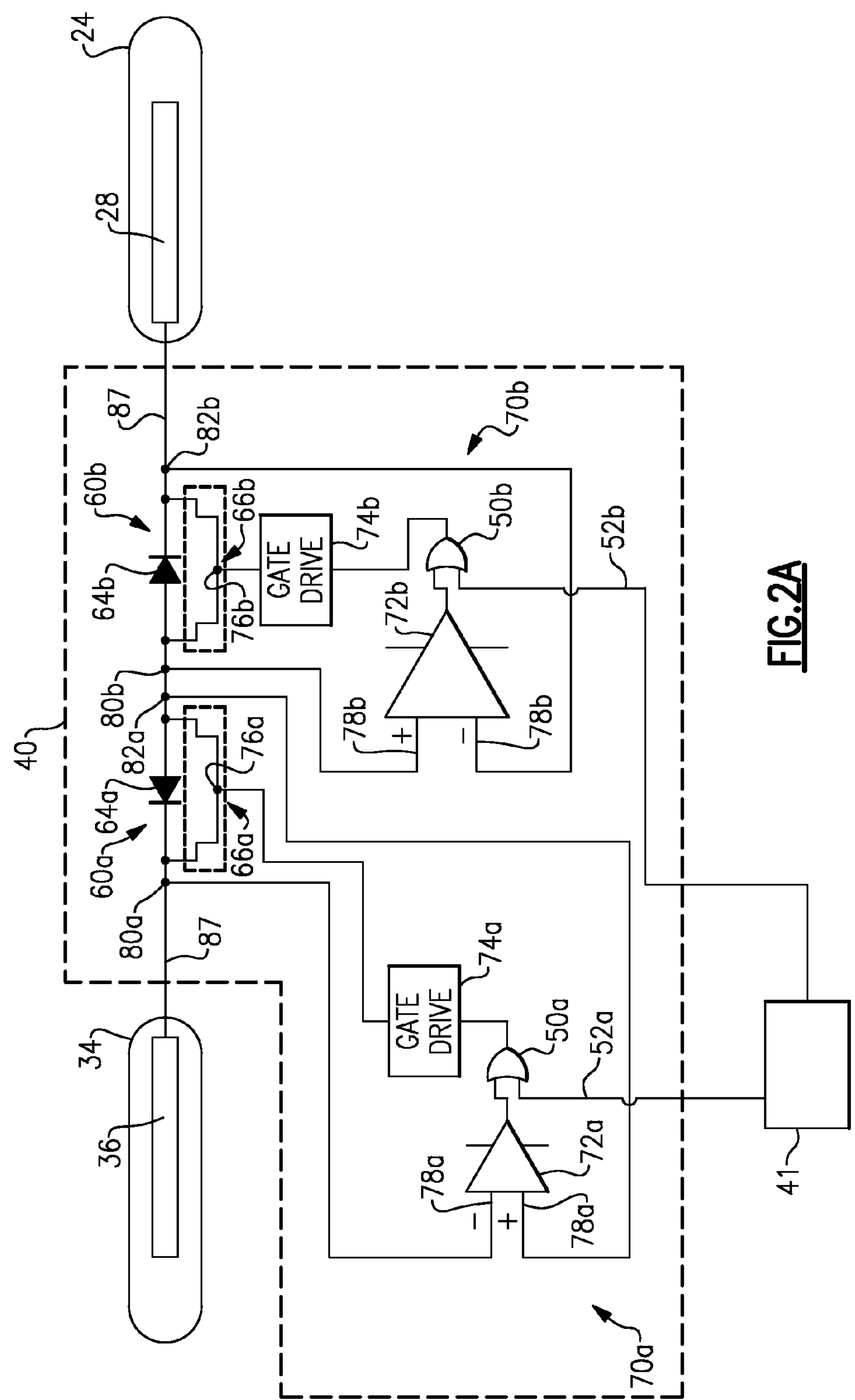
FIG. 2A is a schematic view of the SSC assembly shown in FIG. 1 in an OFF state.
Figure 2B:
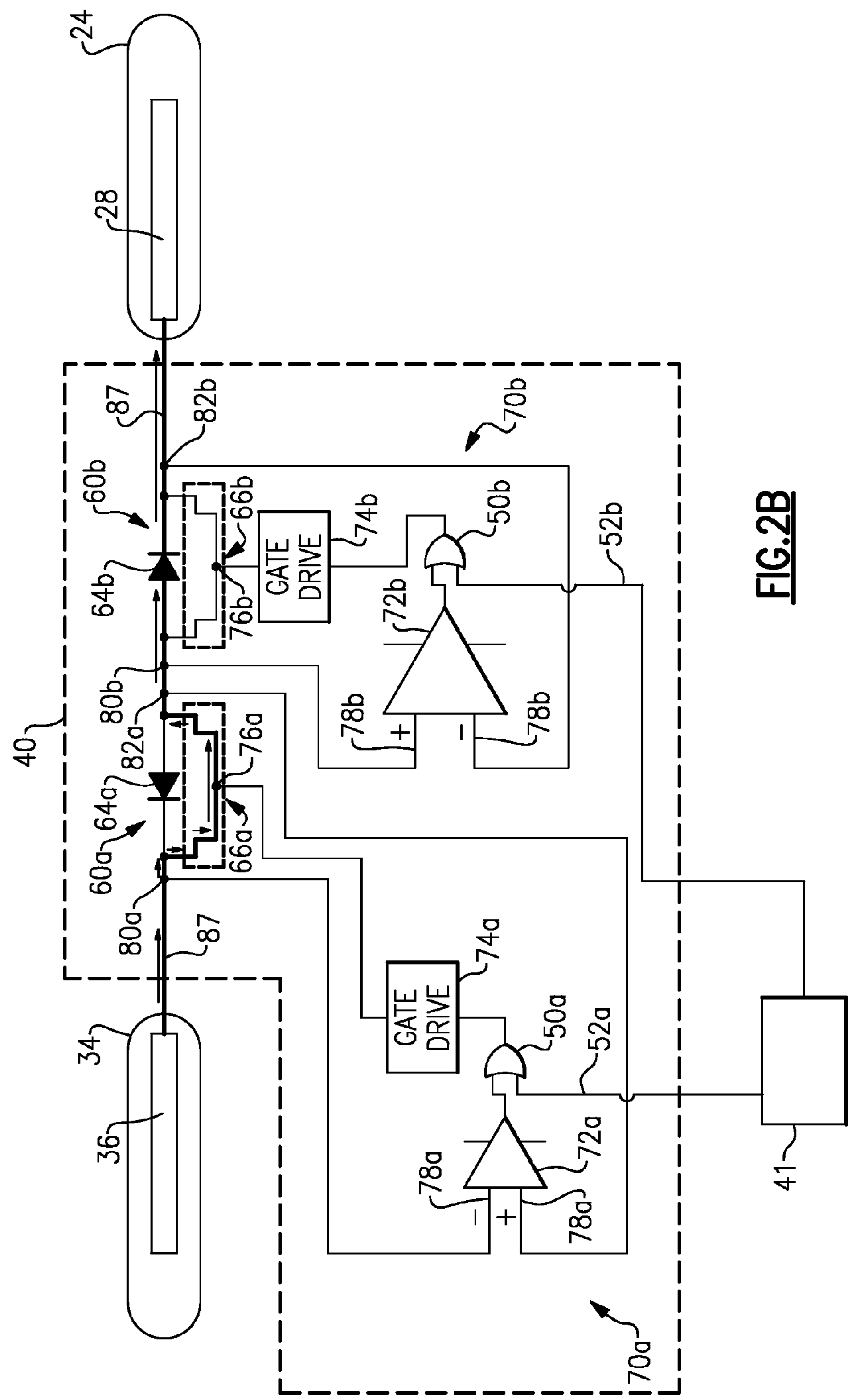
FIG. 2B is a schematic view of the SSC assembly shown in FIG. 1 in the ON state.
Figure 2C:
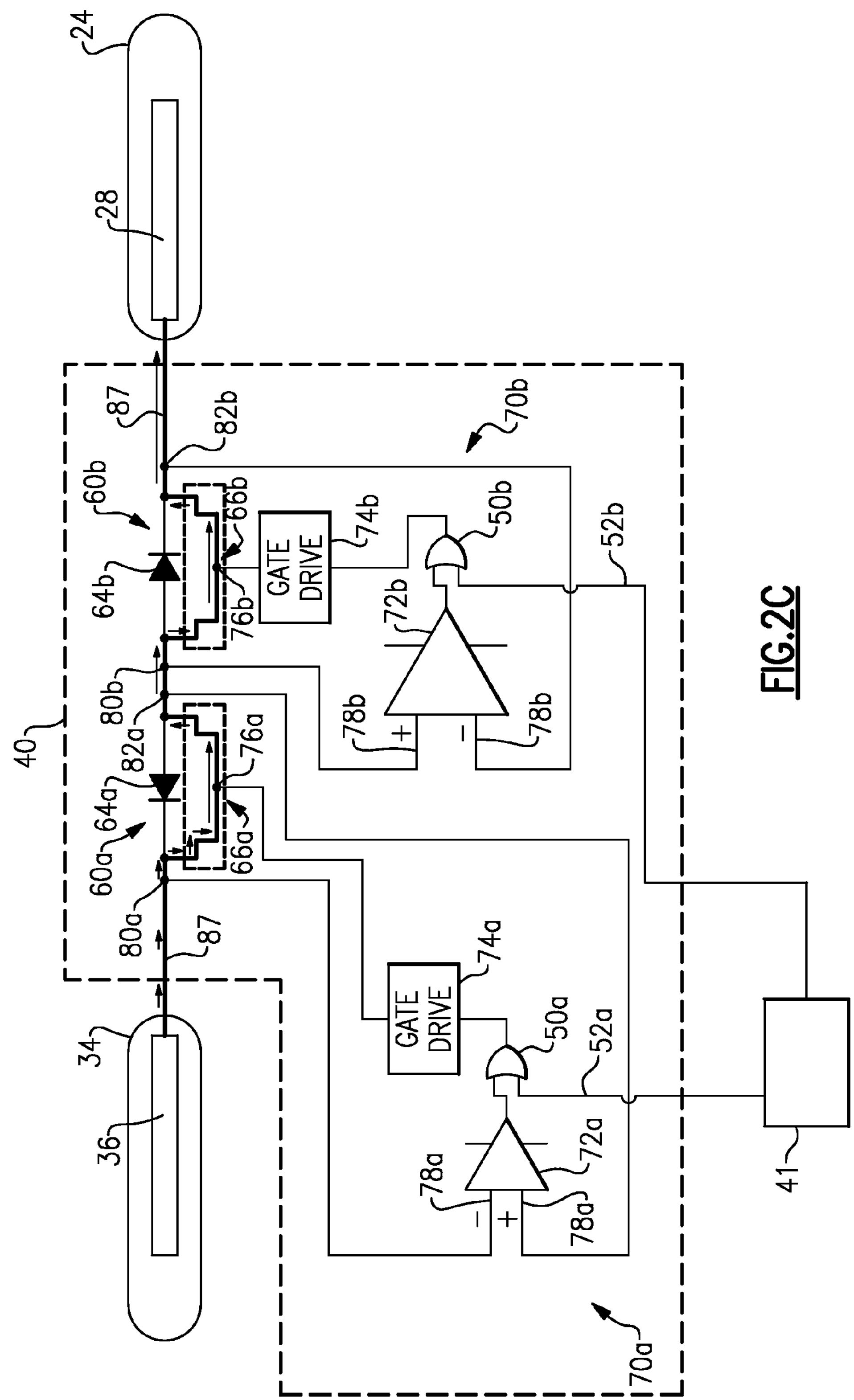
FIG. 2C is a schematic view of the SSC assembly shown in FIG. 1 in another ON state.

Referring to FIG. 2A-2C, the SCC 40 is disposed on internal bus bar 87 and includes a switching element 60*a* and a switching element 60*b*. The features of the SSC 40' would be similar to the SSC 40. Switching elements 60*a*, 60*b* are in series and each include a diode 64 in parallel with a FET 66. The diode 64*a* of switching element 60*a* is directed in an opposite direction from the diode 64*b* of switching element 60*b*. Switching element 60*a* is electrically coupled to the bus bar 36 of the secondary bus 34 while switching element 60*b* is electrically coupled to bus bar 28 of essential DC bus 24.

Each switching element 60*a*, 60*b* is electrically coupled to a control device 70*a*, 70*b*. Control device 70*a* includes a comparator 72*a*, a gate drive 74*a*, and an OR gate 50*a* connected to the comparator 72*a* and having a control input 52*a* controlled by the power panel control unit 41. Control device 70*b* includes a comparator 72*b*, a gate drive 74*b*, and an OR gate 50*b* connected to the comparator 72*b* and having a control input 52*b* controlled by the power panel control unit 41. Each comparator 72*a*, 72*b* has inputs 78*a*, 78*b* connected on either side of each switching element 60*a*, 60*b*. The comparator 72*a*, 72*b* is thus able to read a voltage drop across the connected switching element 60*a*, 60*b*.

The comparator 72*a*, 72*b* uses inputs 78*a* and 78*b* to compare the voltage drop across connected switching element 60*a*, 60*b*. When there is a voltage drop from first position 80*b* to second position 82*b* of switching element 60*b*, the gate drive 74*b* communicates with the connected gate 76*b* of the attached FET 66*b* to instruct the FET 66*b* to close the gate 76*b* and allow flow through the FET 66*b*. However, if the comparator 72*b* reads a voltage drop from second position 82*b* to first position 80*b*, there is electric current flowing towards the secondary bus 34 as opposed to the essential DC bus 24. The comparator 72*b* then communicates with the gate drive 74*b*, which in turn communicates to open the gate 76*b* of the FET 66*b* and prevent current flow through the FET 66*b*. When the gate 76*b* is open, the diode 64*b* of the switching element 60*b* will block flow towards the secondary bus 34. After the voltage drop direction is reversed back in the direction of the essential DC bus 24, the comparator 72*b* will again communicate with the gate drive 74*b* to order the FET 66*b* to close its gate 76*b* and allow current to flow through the FET 66*b* again. The gate drive 74*a*, comparator 72*a*, diode 64*a*, FET 66*a*, and gate 76*a* of switching element 60*a* operate in substantially the same manner for electrical current that is intended to flow from the essential DC bus 24 towards secondary bus 34.

In FIG. 2A, the bus bars 28, 36 are shown in an OFF state. Therefore, no current is moving through the SSC 40 and there is no flow through either switching element 60*a*, 60*b*.

In this example, the FET 66*a*, 66*b* is a power MOSFET; however, other FETs 66*a*, 66*b* may be used.

In FIG. 2B, the bus bar 36 of the secondary bus 34 is in an ON state such the power panel control unit 41 signals electrical current to be available through the SSC assembly 40 to the bus bar 28 of the essential DC bus 24. Control input 52*a* signals OR gate 50*a* to close the gate 76*a* of the FET 66*a*. Control input 52*b* is inactive such that the comparator 72*b* signals the gate 76*b* of FET 66*b* to open or close. In this example, during system power up, current moves through the FET 66*a* of switching element 60*a* and through the diode 64*b* of switching element 60*b* to establish the direction of the electrical current. In this example, the direction of the electrical current is from secondary bus 34 to essential DC bus 24. When the essential DC bus 24 is powered by TRU 22, diode 64*b* prevents electrical current from flowing from essential DC bus 24 to secondary bus 34.

In FIG. 2C, once the direction of the electrical current is established the bus bar 36 of the secondary bus 34 remains in an ON state and continues to distribute current through the SSC assembly 40 to the bus bar 28 of the essential DC bus 24. In this example, after the direction is established, switching element 60*b* moves current through the FET 66*b* instead of the diode 64*b*, generating power savings.

While the current moves through the FET 66*a* of switching element 60*a* and through the FET 66*b* of switching element 60*b* to the bus bar 28 of the essential DC bus 24, the comparator 72*a* reads a voltage drop from first position 80*a* to second position 82*a* for switching element 60*a* and the comparator 72*b* reads a voltage drop from first position 80*b* to second position 82*b* for switching element 60*b*.

When the comparator 72*b* detects a voltage drop across switching element 60*b* from second position 82*b* to first position 80*b*, the gate drive 74*b* is instructed to communicate with the FET 66*b* to open the gate 76*b* of the FET 66*b*. (This position is shown in FIG. 2B.) If current is moving from essential DC bus 24 to secondary bus 34, the control device 70*a* connected to switching element 60*a* would work in a similar manner as the control device 70*b* connected to switching element 60*b*.

As a result of gate 76*b* of switching element 60*b* being open, current cannot move through the FET 66*b* and instead moves through diode 64*b* of switching element 60*b*. Because the diode 64*b* forces current in a singular direction, the voltage drop direction is reversed. When the comparator 72*b* detects a voltage drop from first position 80*b* to second position 82*b*, it will communicate to the gate drive 74*b* to order the gate 76*b* closed and current will flow through FET 66*b* of switching element 60*b*.

Although the example electric current in FIGS. 2A-2C is shown flowing through the SSC 40 from secondary bus 34 to essential DC bus 24, flow may move through the SSC 40 in the opposite direction in a the same manner as described above. When power panel control unit 41 signals electric current to flow from essential DC bus 24 to secondary bus 34, control input 52*a* and control input 52*b* are reversed such that control input 52*a* is inactive and control input 52*b* signals OR gate 50*b* to close the gate 76*b* of the FET 66*b*.

By using SSC assembly 40, a single assembly 40 is able to implement flow pathways of numerous traditional combinations, such as a contactor, a contactor and diode in parallel, and contactor in series with a diode. By using a FET 66*a*, 66*b* in parallel with a diode 64*a*, 64*b* within the assembly 40, the losses due to voltage drop through diodes are reduced as diodes are only used to determine flow direction. Additionally, by using a single component, the SSC assembly 40, the size and weight of the electrical power center 26 is minimized.

Although example embodiments have been disclosed, a worker of ordinary skill in the art would recognize that certain modifications would come within the scope of the claims. For that reason, the following claims should be studied to determine the true scope and content.

What is claimed is:

1. A chip on bus bar solid state contactor assembly comprising:

a switching element having a field-effect transistor and a diode in parallel, the switching element configured to communicate electric current along a current flow path extending from a first bus bar to a second bus bar such that the switching element determines a direction of the electrical current; and a control device configured to selectively communicate current along a portion of the current flow path through the field-effect transistor or the diode of the switching element; and at least one additional switching element having a field-effect transistor and a diode in parallel, the additional switching element configured to selectively communicate current along another portion of the current flow path.

2. A chip on bus bar solid state contactor assembly comprising:

a switching element having a field-effect transistor and a diode in parallel, the switching element configured to communicate electric current along a current flow path extending from a first bus bar to a second bus bar such that the switching element determines a direction of the electrical current; and a control device configured to selectively communicate current along a portion of the current flow path through the field-effect transistor or the diode of the switching element, wherein the control device includes a comparator in communication with a gate driver, the gate driver configured to selectively open and shut a gate of the field-effect transistor in response to an instruction from the comparator.

3. The assembly of claim 2, wherein the field-effect transistor is a metal-oxide-semiconductor field-effect transistor.

4. A chip on bus bar solid state contactor assembly comprising:

a switching element having a field-effect transistor and a diode in parallel, the switching element configured to communicate electric current along a current flow path extending from a first bus bar to a second bus bar such that the switching element determines a direction of the electrical current; and a control device configured to selectively communicate current along a portion of the current flow path through the field-effect transistor or the diode of the switching element, wherein a comparator selectively communicates the current through the field-effect transistor or the diode in response to a voltage drop in a first direction across each switching element.

5. The assembly of claim 4, wherein the first bus is a DC bus.

6. A power distribution system for an aircraft comprising:

a first DC bus having a first bus bar electrically isolated from a second DC bus having a second bus bar;

an aircraft component electrically connected to the first bus bar; and a solid state contactor assembly electrically connecting the first bus bar and the second bus bar, the contactor assembly including a control device and a plurality of switching elements, each of the switching elements including a field-effect transistor and diode in parallel, wherein the control device is configured drive the switching elements to control an electrical current between the first and second bus bars such that the switching elements determine a direction of the electrical current.

7. The system of claim 6, wherein the solid state contactor assembly is a chip on bus bar solid state contactor assembly.

8. The system of claim 6, wherein current moves through the field-effect transistor of each switching element in the plurality of switching elements.

9. The system of claim 6, wherein the control device includes a comparator configured to be capable of measuring a voltage drop across the plurality of switching elements in a first direction.

10. The system of claim 9, wherein current moves across a first switching element through the diode in response to a voltage drop across the first switching element in a second direction opposite the first direction.

11. The system of claim 10, wherein current moves through the field-effect transistor in the first switching element in response to a voltage drop re-established in the first direction.

12. The system of claim 6 further comprising a second solid state contactor assembly connecting a third bus bar to the first bus bar.

13. The system of claim 6 further comprising a plurality of solid state contactor assemblies and a plurality of DC busses, wherein each DC bus has a solid state contactor assembly.

14. The system of claim 6 further comprising an AC bus electrically coupled to a transformer rectifier unit such that the AC bus is configured to provide current to the first DC bus.

15. The system of claim 14, wherein the first DC bus is connected to an external component, wherein the first DC bus is configured to be capable of providing 28V to the external component.

16. A method of connecting a first bus bar and second bus bar comprising:

electrically connecting the first bus bar to the second bus bar using a solid state contactor assembly, the solid state contactor assembly having a plurality of switching elements each having a field-effect transistor and a diode in parallel; and controlling the direction of electrical current between the first bus bar and the second bus bar using the plurality of switching elements.

17. The method of claim 16, further comprising moving current across each switching element through the field-effect transistor in a first direction towards the first DC bus.

18. The method of claim 17, further comprising moving current across at least one switching element through the diode in response to a voltage drop in a direction opposite the first direction.

19. The method of claim 18, further comprising moving current across the at least one switching element through the field-effect transistor in response to the voltage drop in the first direction.

20. The method of claim 18, wherein the step of driving the switching elements is performed by a control device having a comparator in communication with a gate drive, the gate drive in communication with a gate of the field-effect transistor.

21. A chip on bus bar solid state contactor assembly comprising:

a switching element having a field-effect transistor and a diode in parallel, the switching element configured to communicate electric current along a current flow path extending from a first bus bar to a second bus bar such that the switching element determines a direction of the electrical current; and a control device configured to selectively communicate current along a portion of the current flow path through the field-effect transistor or the diode of the switching element, wherein the control device includes a gate drive and an OR gate.

* * * * *